(12) United States Patent
Uchida et al.

(10) Patent No.: US 11,756,881 B2
(45) Date of Patent: Sep. 12, 2023

(54) SEMICONDUCTOR DEVICE (71) Applicant: RENESAS ELECTRONICS CORPORATION, Tokyo (JP)

(72) Inventors: Shinichi Uchida, Tokyo (JP); Yasutaka Nakashiba, Tokyo (JP); Shinichi Kuwabara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 90 days.

(21) Appl. No.: 17/231,623

(22) Filed: Apr. 15, 2021

(65) Prior Publication Data

US 2021/0366827 A1 Nov. 25, 2021

(30) Foreign Application Priority Data

May 22, 2020 (JP) .................................. 2020-090116

(51) Int. Cl.
*H01L 23/522* (2006.01)
*H01F 27/28* (2006.01)
*H01L 23/00* (2006.01)

(52) U.S. Cl.
CPC ..... *H01L 23/5227* (2013.01); *H01F 27/2804* (2013.01); *H01L 23/5226* (2013.01); *H01L 24/48* (2013.01); *H01L 2224/48137* (2013.01)

(58) Field of Classification Search
CPC . H01L 23/5227; H01L 23/5226; H01L 24/48; H01L 2224/48137; H01F 27/2804
USPC ...................................................... 257/531
See application file for complete search history.

(56) References Cited

U.S. PATENT DOCUMENTS

| 8,410,493 | B2 | 4/2013 | Nakashiba | |
|---|---|---|---|---|
| 11,145,597 | B2 | 10/2021 | Kuwabara et al. | |
| 2014/0204548 | A1* | 7/2014 | Sekine | H01L 28/20 361/761 |
| 2018/0295724 | A1* | 10/2018 | Sturcken | H01F 17/0033 |

FOREIGN PATENT DOCUMENTS

| JP | S61-208911 A | 9/1986 |
|---|---|---|
| JP | 2007-180436 A | 7/2007 |
| JP | 2010-34290 A | 2/2010 |
| JP | 2010-219122 A | 9/2010 |
| JP | 2020-21835 A | 2/2020 |

OTHER PUBLICATIONS

Office Action issued in corresponding Japanese Patent Application No. 2020-090116, dated Jul. 4, 2023, with English translation.

* cited by examiner

*Primary Examiner* — Tu-Tu V Ho
(74) *Attorney, Agent, or Firm* — McDermott Will & Emery LLP (57) ABSTRACT

A semiconductor device includes: a first substrate; a multilayer wiring layer formed on the first substrate; a first inductor formed into a meander shape on the multilayer wiring layer in a plan view; and a second inductor formed into a meander shape on the multilayer wiring layer in a plain view, and arranged so as to be close to the first inductor in a plan view and not to overlap with the first inductor. A transformer is configured by the first inductor and the second inductor and, in a plan view, the first inductor and the second inductor extend along a first direction in which one side of the first substrate extends.

11 Claims, 9 Drawing Sheets

SEMICONDUCTOR DEVICE

CROSS-REFERENCE TO RELATED APPLICATIONS

The present application claims priority from Japanese Patent Application No. 2020-090116 filed on May 22, 2020, the content of which is hereby incorporated by reference to this application.

BACKGROUND

The present disclosure relates to a semiconductor device, and is applicable to, for example, a semiconductor device having an inductor.

When an electric signal is transmitted between two circuits different from each other in a potential of an electric signal to be inputted, a photocoupler is often used as an optical isolator. The photocoupler has a light emitting element such as a light emitting diode and a light receiving element such as a phototransistor, converts the inputted electric signal into light by the light emitting element, and returns this light to the electric signal by the light receiving element, thereby transmitting the electric signal.

However, since the photocoupler has the light emitting element and the light receiving element, its miniaturization is difficult. Further, when a frequency of the electric signal is high, the photocoupler cannot follow the electric signal. As a technique for solving these problems, a technique for transmitting the electric signal by a transformer that inductively couples two inductors has been developed. An isolator is configured by using this transformer. For example, Patent Document 1 (Japanese Patent Application Laid-open No. 2010-219122) is disclosed.

SUMMARY

When the electric signal is transmitted by inductively coupling the two inductors provided in a semiconductor device, the semiconductor device may become large in size by providing these two inductors.

In one aspect of the present disclosure, the two inductors are each shaped like a meander to form a transformer. In addition, the isolator is configured by using the transformer.

According to the above semiconductor device, it is possible to reduce an increase in its size.

DETAILED DESCRIPTION

Hereinafter, embodiments and modification examples will be described with reference to the drawings. However, in the following description, the same components may be denoted by the same reference numerals, and a repetitive description thereof maybe omitted. Incidentally, in order to clarify the explanation, the drawings may schematically represent a width, thickness, and shape, etc. of each part as compared with the actual embodiment, but this is just an example, and the schematical representation is not used for limiting the interpretation of the present disclosure.

Figure 1:
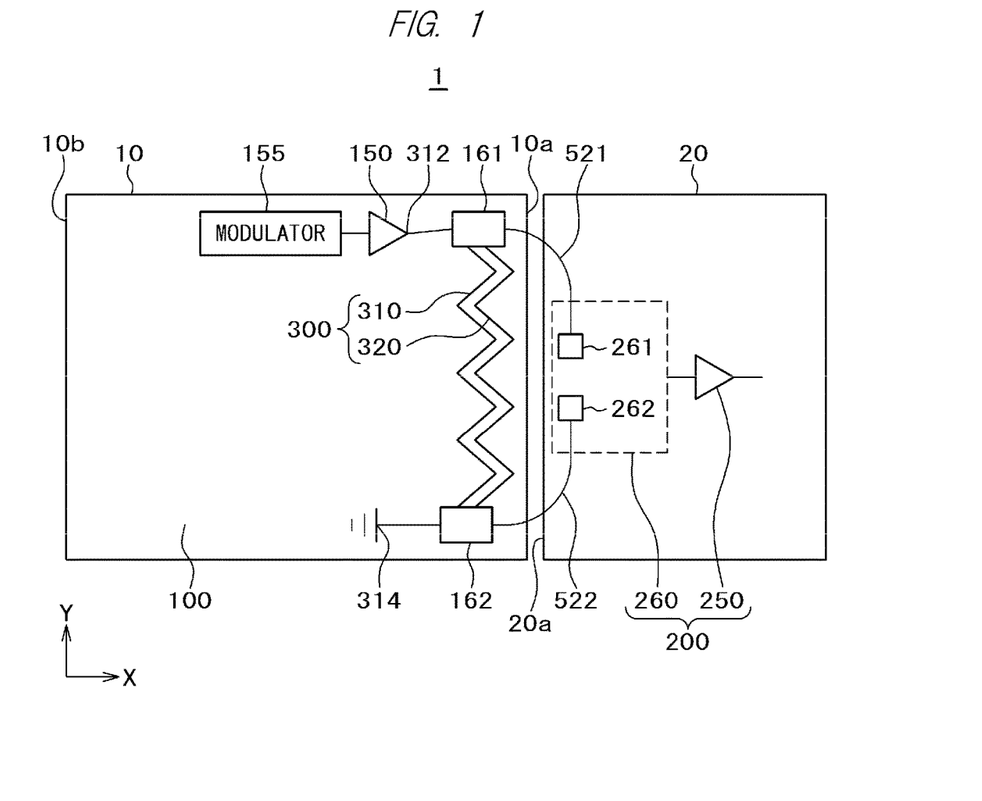
FIG. 1 is a plan view of a semiconductor device according to an embodiment.
Figure 2:
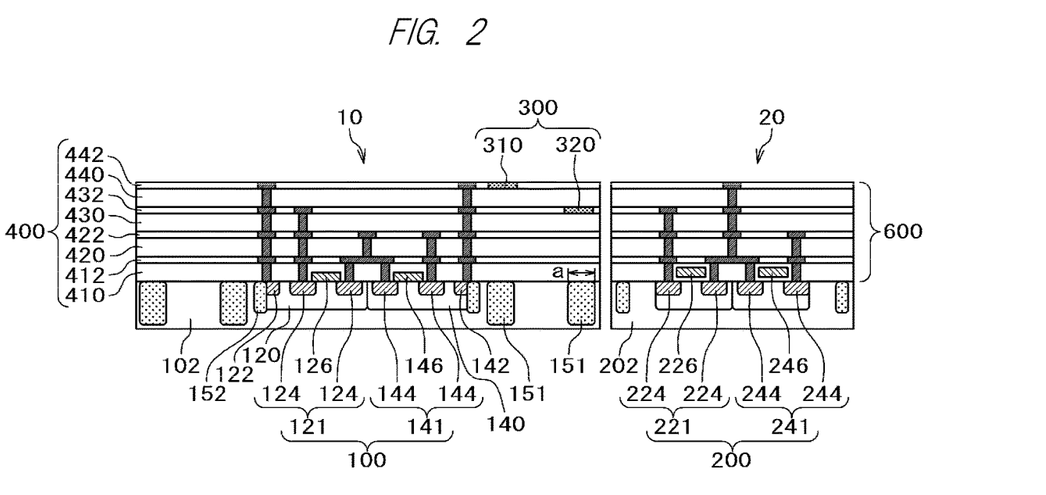
FIG. 2 is a cross-sectional view of the semiconductor device shown in FIG. 1.

FIG. 1 is a schematic plan view of a semiconductor device according to an embodiment. FIG. 2 is a cross-sectional view showing a configuration of the semiconductor device shown in FIG. 1.

As shown in FIG. 1, a semiconductor device 1 has a first semiconductor chip 10 and a second semiconductor chip 20, and configures an isolator. In a plan view, a first side 10a extending in a Y-axis direction of the first semiconductor chip 10 is arranged so as to be close to and opposed to a first side 20a extending in a Y-axis direction of the second semiconductor chip 20. The first semiconductor chip 10 includes a first circuit 100, a first inductor 310, and a second inductor 320. The second semiconductor chip 20 has a second circuit 200.

In a plan view, the first inductor 310 and the second inductor 320 are close to the first side 10a and extend along the first side 10a. At least a part of the first circuit 100 is located on a second side 10b side facing the first side 10a with respect to the first inductor 310 and the second inductor 320.

The first inductor 310 and the second inductor 320 configure a transformer 300 as a signal transmission element, and transmit electric signals to each other by inductively coupling to each other. The electric signal is, for example, a digital signal, but may be an analog signal.

The first inductor 310 is connected to the first circuit 100, and the second inductor 320 is connected to the second semiconductor chip 20. The first circuit 100 is a transmission circuit. That is, the first inductor 310 functions as a transmitting side inductor, and the second inductor 320 functions as a receiving side inductor. A wiring that connects the second inductor 320 and the second semiconductor chip 20 is, for example, bonding wires 521 and 522. The second circuit 200 includes a receiving circuit, and is connected to the second inductor 320 via the bonding wires 521 and 522.

The first circuit 100 includes: a modulation processing unit 155 that modulates a digital signal into a signal for transmission; and a transmission side driver circuit 150 that outputs the modulated signal to the first inductor 310. The second circuit 200 includes a receiving circuit 260 connected to the second inductor 320, and a receiving driver circuit 250 (for example, a gate driver). The receiving circuit 260 demodulates the modulated signal into a digital signal. The digital signal demodulated by the receiving circuit 260 is outputted to the receiving driver circuit 250.

In the first circuit 100 and the second circuit 200, potentials of the inputted electric signals are different from each other, but since the first inductor 310 and the second inductor 320 transmit and receive the electric signals by using inductive coupling, no problem arises about the first circuit 100 and the second circuit 200. That is, the first inductor 310 and the second inductor 320 configure a transformer. Incidentally, a case of "the potentials of the inputted electric signals are different from each other" in a configuration of FIG. 1 is, for example, as follows:

(a) a case where amplitudes (difference between a potential indicating 0 and a potential indicating 1) of the electrical signals are different from each other;

(b) a case where reference potentials (a potential indicating 0) of the electric signals are different; and (c) a case where the amplitudes of the electric signals are different from each other and the reference potentials of the electric signals are different.

As shown in FIG. 2, the first circuit 100 of the first semiconductor chip 10 is formed on the first substrate 102. Here, the first substrate 102 is a semiconductor substrate such as a silicon substrate. A multilayer wiring layer 400 is formed on the first substrate 102. The first inductor 310 is formed on the multilayer wiring layer 400. The second inductor 320 is formed in the multilayer wiring layer 400 and, as shown in FIG. 1, does not overlap with the first inductor 310 in a plan view.

The first circuit 100 of the first semiconductor chip 10 has a first transistor. The first transistor includes a first conductive type first transistor 121 and a second conductive type first transistor 141. The first conductive type first transistor 121 is formed in a second conductive type well 120, and has two of a first conductive type impurity region 124 and a gate electrode 126 each serving as a source and a drain. The second conductive type first transistor 141 is formed on the first conductive type well 140, and has two of a second conductive type impurity region 144 and a gate electrode 146 each serving as a source and a drain. A gate insulating film is located under each of gate electrodes 126 and 146. These two of the gate insulating films are substantially equal in thickness. The first transistors 121 and 141 configure the above-mentioned transmission side driver circuit, for example, an inverter.

A second conductive type impurity region 122 is formed in a well 120, and a first conductive type impurity region 142 is formed in a well 140. A wiring that gives a ground potential as a reference potential of the first conductive type first transistor 121 is connected to the impurity region 122, and a wiring that gives a reference potential of the second conductive type first transistor 141 is connected to the impurity region 142.

A second circuit 200 of the second semiconductor chip 20 is formed in the second substrate 202. Here, the second substrate 202 is a semiconductor substrate such as a silicon substrate. A multilayer wiring layer 600 is formed on the second substrate 202.

The second circuit 200 has a second transistor. The second transistor also includes a first conductive type second transistor 221, and a second conductive type second transistor 241. The first conductive type second transistor 221 is formed in the second conductive type well 220, and has two of a first conductive type impurity region 224 and a gate electrode 226 each serving as a source and a drain. The second conductive type second transistor 241 is formed in the first conductive type well 240, and has two of a second conductive type impurity region 244 and a gate electrode 246 each serving as a source and a drain. A gate insulating film is located under each of the gate electrodes 226 and 246. The second transistors 221 and 241 configure the receiving driver circuit 250 and the receiving circuit 260 as described above.

A second conductive type impurity region 222 is formed in the well 220, and a first conductive type impurity region 242 is formed in the well 240. A wiring that gives a reference potential of the first conductive type second transistor 221 is connected to the impurity region 222, and a wiring that gives a reference potential of the second conductive type second transistor 241 is connected to the impurity region 242.

In the example shown in FIG. 2, the first transistors 121 and 141 and the second transistors 221 and 241 have mutually different gate insulating films, but may be the same.

The first inductor 310 and the second inductor 320 are wiring patterns having meander shapes and formed in mutually different wiring layers. The first inductor 310 is located, for example, in an upper wiring layer 442, and the second inductor 320 is located, for example, in a wiring layer 432 one layer below the uppermost layer.

The multilayer wiring layer 400 is formed by alternately laminating an insulating layer and a wiring layer t times (t≥3) or more in this order. The second inductor 320 is provided in a n-th wiring layer of the multilayer wiring layer 400. The first inductor 310 is provided in the m-th wiring layer (t≥m≥n+1) of the multilayer wiring layer, and is located above the second inductor 320. That is, the first inductor 310 and the second inductor 320 are formed in mutually different wiring layers. Further, none of the wiring layers located between the n-th wiring layer and the m-th wiring layer is provided with the inductor located above the second inductor 320. In the present embodiment, the multilayer wiring layer 400 has a configuration in which an insulating layer 410, a wiring layer 412, an insulating layer 420, a wiring layer 422, an insulating layer 430, a wiring layer 432, an insulating layer 440, and a wiring layer 442 are stacked in this order. Here, the wiring layers 412, 422, 432, and 442 are composed of an insulating film and a conductor film. The insulating layers 410, 420, 430, and 440 may have a structure in which a plurality of insulating films are laminated, or may be a single insulating film.

The wiring located in the wiring layers 412, 422, 432, and 442 is a copper (Cu) wiring formed by a damascene method, and is embedded in each trench formed in the insulating layers of the wiring layers 412, 422, 432, and 442. A pad (not shown) is formed on or in the uppermost wiring. Incidentally, at least one of the wiring layers 412, 422, 432, and 442 as described above may be an Al alloy wiring. Incidentally, the wirings formed in the wiring layers 412, 422, 432, and 442 are connected to each other via plugs embedded in the insulating layers 410, 420, 430, and 440.

Each insulating film configuring the insulating layer and the wiring layer may be a silicon oxide ($SiO_2$) film or a low dielectric constant film. The low dielectric constant film can be set as, for example, an insulating film having a relative permittivity of 3.3 or less, preferably 2.9 or less.

Bonding pads 161 and 162 are located on a side of the first side 10a facing (opposite to) the second semiconductor chip 20, and the first inductor 310 and the second inductor 320 extend along the first side 10a and between the bonding pads 161 and 162. As described above, the first circuit 100 is located on a side of the second side 10b with respect to the first inductor 310 and the second inductor 320. The first circuit 100 includes a transmitting side driver circuit 150. As described above, the transmission side driver circuit 150 is composed of at least a part, for example, a part of an inverter by the first transistors 121 and 141. One end 312 of the first inductor 310 is connected to the transmission side driver circuit 150. Incidentally, the other end 314 of the first inductor 310 is connected to a power supply wiring or a ground wiring.

Next, an outline of a method of manufacturing the first semiconductor chip 10 will be described. First, the first circuit 100 is formed on the first substrate 102. Next, the multilayer wiring layer 400 is formed on the first substrate 102. When the multilayer wiring layer 400 is formed, the first inductor 310 and the second inductor 320 are formed. Further, the first inductor 310 is connected to the first circuit 100 via the wiring provided in the multilayer wiring layer 400.

Figure 3:
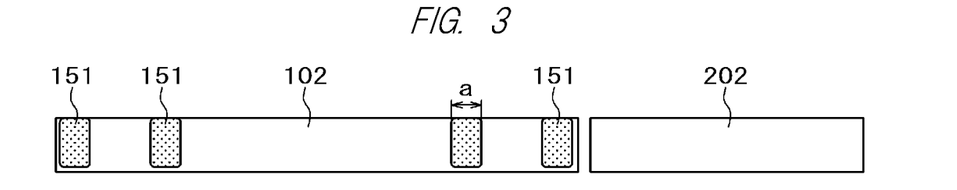
FIG. 3 is a cross-sectional view for explaining a method of manufacturing the semiconductor device shown in FIG. 1.
Figure 4:
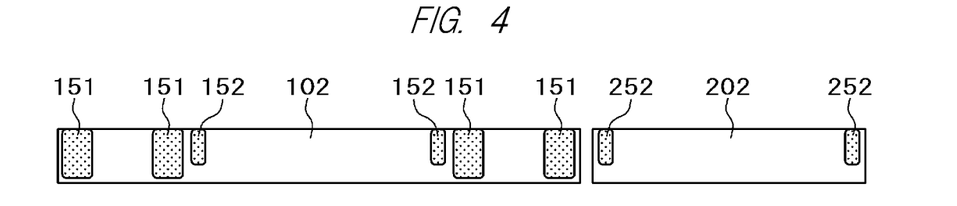
FIG. 4 is a cross-sectional view for explaining the method of manufacturing the semiconductor device shown in FIG. 1.
Figure 5:
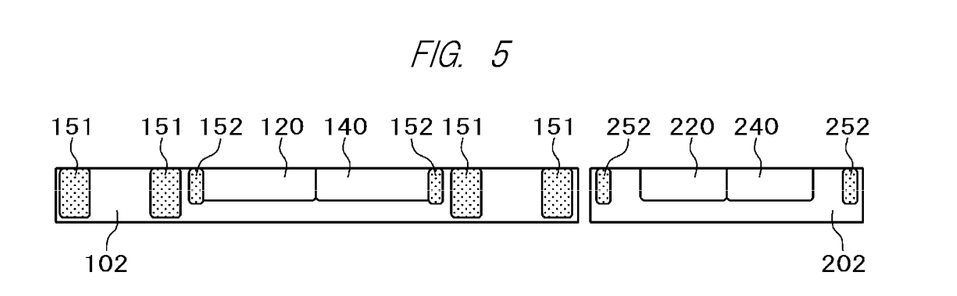
FIG. 5 is a cross-sectional view for explaining the method of manufacturing the semiconductor device shown in FIG. 1.
Figure 6:
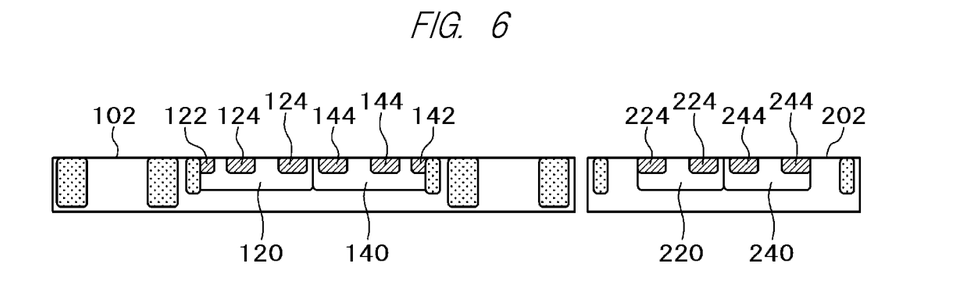
FIG. 6 is a cross-sectional view for explaining the method of manufacturing the semiconductor device shown in FIG. 1.
Figure 7:
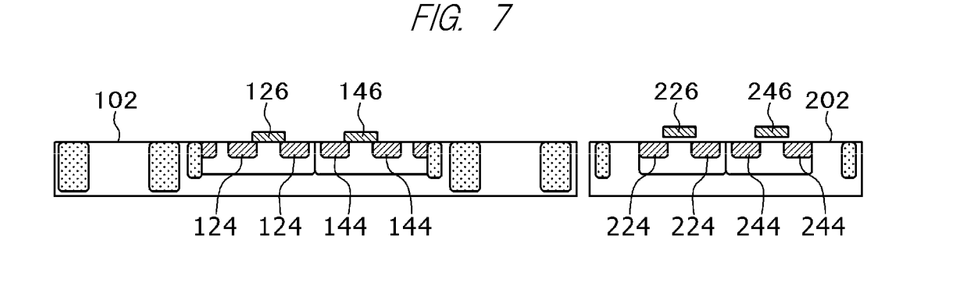
FIG. 7 is a cross-sectional view for explaining the method of manufacturing the semiconductor device shown in FIG. 1.
Figure 8:
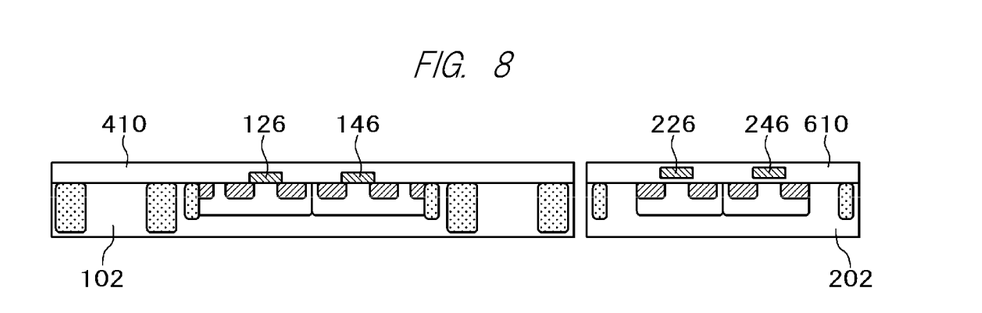
FIG. 8 is a cross-sectional view for explaining the method of manufacturing the semiconductor device shown in FIG. 1.
Figure 9:
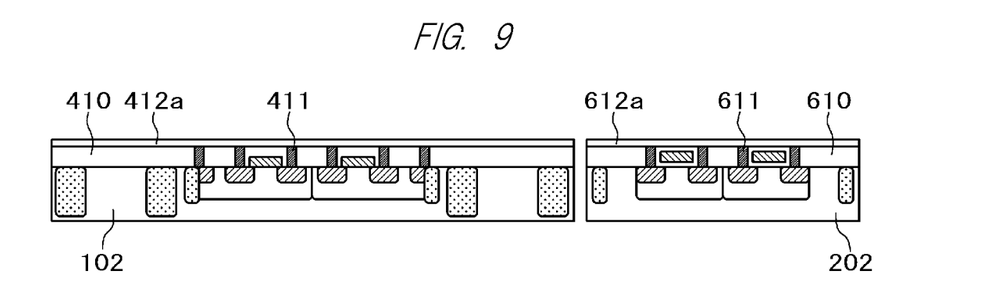
FIG. 9 is a cross-sectional view for explaining the method of manufacturing the semiconductor device shown in FIG. 1.
Figure 10:
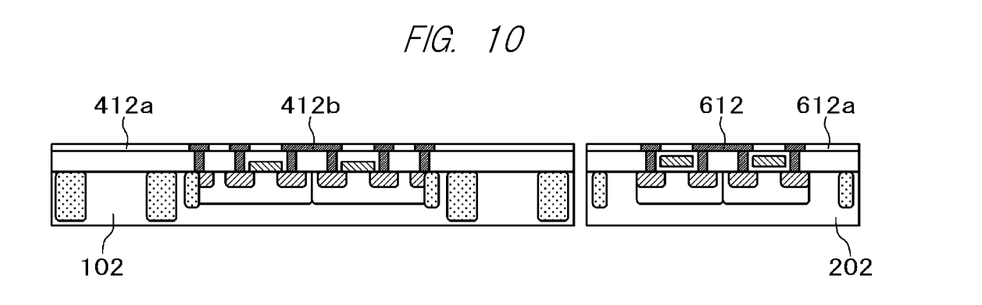
FIG. 10 is a cross-sectional view for explaining the method of manufacturing the semiconductor device shown in FIG. 1.
Figure 11:
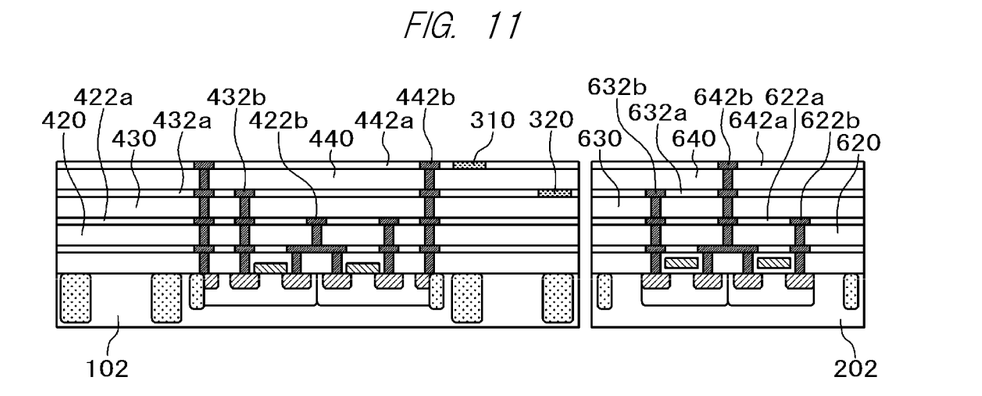
FIG. 11 is a cross-sectional view for explaining the method of manufacturing the semiconductor device shown in FIG. 1.
Figure 12:
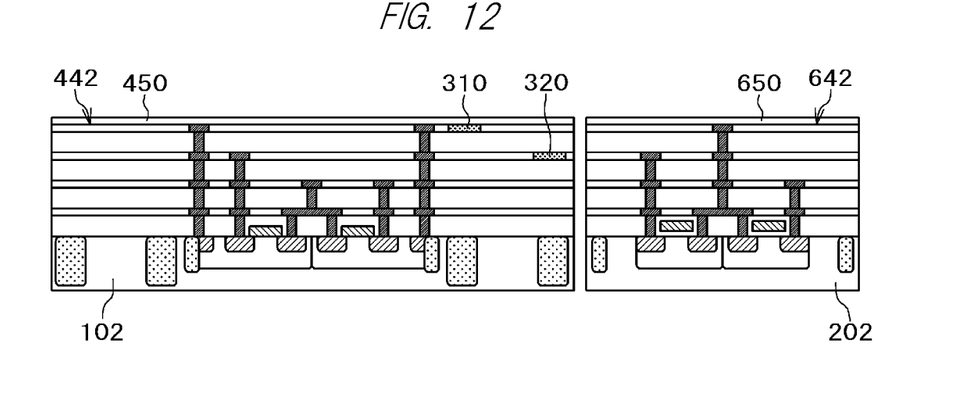
FIG. 12 is a cross-sectional view for explaining the method of manufacturing the semiconductor device shown in FIG. 1.

The first semiconductor chip 10 and the second semiconductor chip 20 will be described in more detail below with reference to FIGS. 3 to 12. FIG. 3 is a cross-sectional view for explaining a process of forming a DTI. FIG. 4 is a cross-sectional view for explaining a process of forming a STI. FIG. 5 is a cross-sectional view for explaining a process of forming a well. FIG. 6 is a cross-sectional view for explaining a process of forming a source and a drain. FIG. 7 is a cross-sectional view for explaining a process of forming a gate. FIG. 8 is a cross-sectional view for explaining a process of forming an insulating layer. FIG. 9 is a cross-sectional view for explaining a process of forming a contact and a first insulating layer. FIG. 10 is a cross-sectional view for explaining a process of forming a wiring of a first layer. FIG. 11 is a cross-sectional view for explaining a process of forming wirings of second to fourth layers. FIG. 12 is a cross-sectional view for explaining a process of forming a protective film.

As shown in FIG. 3, a DTI (Deep Trench Isolation) 151 having a trench deeper than a trench of a STI (Shallow Trench Isolation) 152 of the first transistors 121 and 141 is formed in the first substrate 102. A width (a) of the DTI 151 is preferably wider than each width (b) of the wirings for forming the first inductor 310 and the second inductor 320 to be formed in the DTI 151, and it is more preferably that "a" is wider 2 to 8 μm rightward and leftward with respect to "b". That is, it is preferable that "a" is 4 to 16 μm wider than "b". Incidentally, no DTI is formed on the second substrate 202.

Next, as shown in FIG. 4, the STI 152 for each of the first transistors 121 and 141 is formed in or on the first substrate 102. A STI 252 for each of the second transistors 221 and 241 is formed in or on the second substrate 202.

Next, as shown in FIG. 5, a second conductive type well 120 and a first conductive type well 140 are formed on or in the first substrate 102. A second conductive type well 220 and a first conductive type well 240 are formed on or in the second substrate 202.

Next, as shown in FIG. 6, a first conductive type impurity region 124 and a second conductive type impurity region 122 serving as a source and a drain are formed in the well 120. A second conductive type impurity region 144 and a first conductive type impurity region 142 serving as a source and a drain are formed in the well 140. A first conductive type impurity region 224 and a second conductive type impurity region 222 serving as a source and a drain are formed in the well 220. A second conductive type impurity region 244 and a first conductive type impurity region 242 serving as a source and a drain are formed in the well 240.

Next, as shown in FIG. 7, gate electrodes 126 and 146 are formed by forming agate insulating film on the first substrate 102 and forming a conductor film on the gate insulating film. Gate electrodes 226 and 246 are formed by forming a gate insulating film on the second substrate 202 and forming a conductor film on the gate insulating film.

Next, as shown in FIG. 8, an insulating layer 410 as a wiring interlayer film is formed on the gate electrodes 126 and 146. An insulating layer 610 as a wiring interlayer film is formed on the gate electrodes 226 and 246.

Next, as shown in FIG. 9, after forming a contact hole in the insulating layer 410, a conductor film is formed in the contact hole to form a contact 411. Thereafter, an insulating film 412a is formed on the contact 411 and the insulating layer 410. After forming a contact hole in the insulating layer 610, a conductor film is formed in the contact holes to forma contact 611. Thereafter, an insulating film 612a is formed on the contact 611 and the insulating layer 610.

Next, as shown in FIG. 10, a trench is formed in the insulating film 412a, and a conductor film 412b is formed in the trench to form a wiring layer 412. A trench is formed in the insulating film 612a, and a conductor film 612b is formed in the trench to form a wiring layer 612.

Next, as shown in FIG. 11, insulating layers 420, 430, and 440 as oxide films for damascene wiring are laminated, and wiring layers 422, 432, and 442 are formed by damascene. The wiring layers 422, 432, and 442 form: a wiring for configuring the first inductor 310; a wiring for configuring the second inductor 320; and other wirings 422b, 432b, and 442b. Insulating layers 620, 630, and 640 as oxide films for damascene wiring are laminated, and wiring layers 622, 632, 642 are formed by damascene.

Finally, as shown in FIG. 12, a bonding pad (not shown) and a protective film 450 are formed on the wiring layer 442. A bonding pad (not shown) and a protective film 650 are formed on the wiring layer 642.

Figure 13:
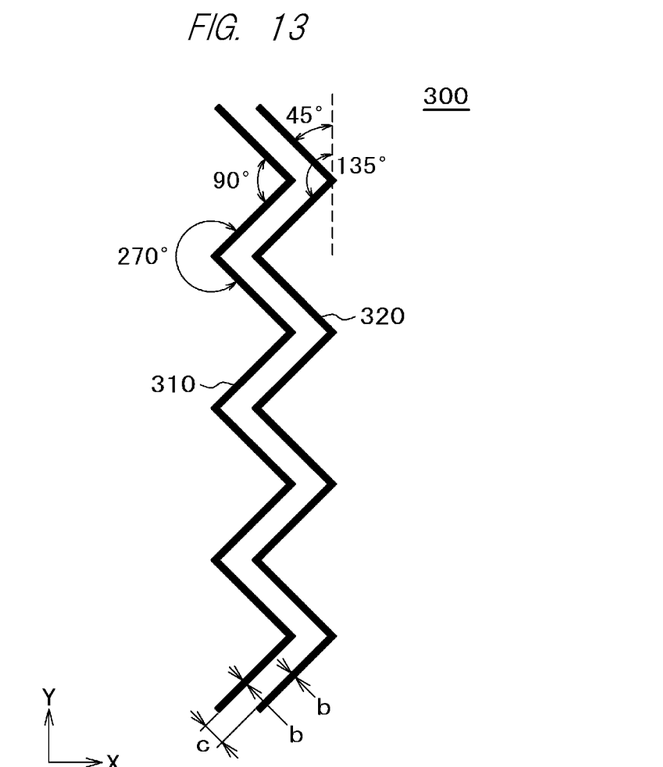
FIG. 13 is a plan view of two inductors shown in FIG. 1.

Shapes of the first inductor 310 and the second inductor 320 configuring the transformer in the embodiment will be described with reference to FIG. 13. FIG. 13 is a plan view showing two inductors in the embodiment.

The wirings configuring the first inductor 310 and the second inductor 320 each have a width of "b", and are arranged at equal intervals (parallel) in a plan view. Here, a distance between the wirings configuring the first inductor 310 and the second inductor 320 is "c", and "c" is larger than "b". The wirings configuring the first inductor 310 and the second inductor 320 are composed of a wiring of 45 degrees or 135 degrees with respect to a Y-axis direction in a plan view. Further, the wirings configuring the first inductor 310 and the second inductor 320 are formed so as to: extend a wiring length while being bent at 90° and 270°; be alternately arranged at bending angles of 90° and 270°; and be extended in the Y-axis direction.

Both ends of the second inductor 320 are electrically connected to the bonding pads 161 and 162, and the first inductor 310 is connected to the transmission side driver circuit 150 as an internal circuit of the first semiconductor chip 10. A modulation signal is transmitted from the transmission side driver circuit 150 to the first inductor 310, and further transmitted to the second inductor 320 by inductive coupling. The bonding pads 161 and 162 connected to the second inductor 320 are connected to bonding pads 261 and 262 of the second semiconductor chip 20 via bonding wires 521 and 522, and are demodulated by the second semiconductor chip 20. For example, when a withstand voltage of 250 V is required, a distance between the first inductor 310 and the second inductor 320 is about 2 μm in length and 10 μm in width.

Next, action and effect of the present embodiment will be described. According to the present embodiment, it has one or more of the followings.

(1) Since the inductor requires a relatively large area, the first semiconductor chip 10 is easily made large when the first inductor 310 and the second inductor 320 are provided on the first semiconductor chip 10 in order to transmit the electric signal. In contrast thereto, in the present embodiment, the inductor is formed into a meander shape. Consequently, the inductance value per unit length is larger than that of the inductor formed by a straight line, and the required inductance value can be obtained without arranging the inductor at the entire periphery of the chip. Therefore, an area that comes (is caused) from a creepage distance between the inductor and the internal circuit can be reduced.

(2) By reducing the number of sides on which the inductor is arranged, an area to be considered by the creepage distance between the chip internal circuit and the inductor becomes small, and its chip area becomes small.

(3) Since there is no region where the wirings are arranged in parallel at 180°, the transformer can be formed without canceling magnetic fields generated between the wirings.

MODIFICATION EXAMPLE

Hereinafter, some typical modification examples of the embodiment will be illustrated. In the following description of the modification example, the same reference numerals as those in the above-described embodiment may be used for portions having the same configuration and function as those described in the above-described embodiment. As for the explanation of such portions, the explanation in the above-described embodiment can be appropriately incorporated within a technically consistent range. In addition, a part of the above-described embodiment and all or a part of the plurality of modification examples can be applied in combination as appropriate within a technically consistent range.

First Modification Example

Figure 14:
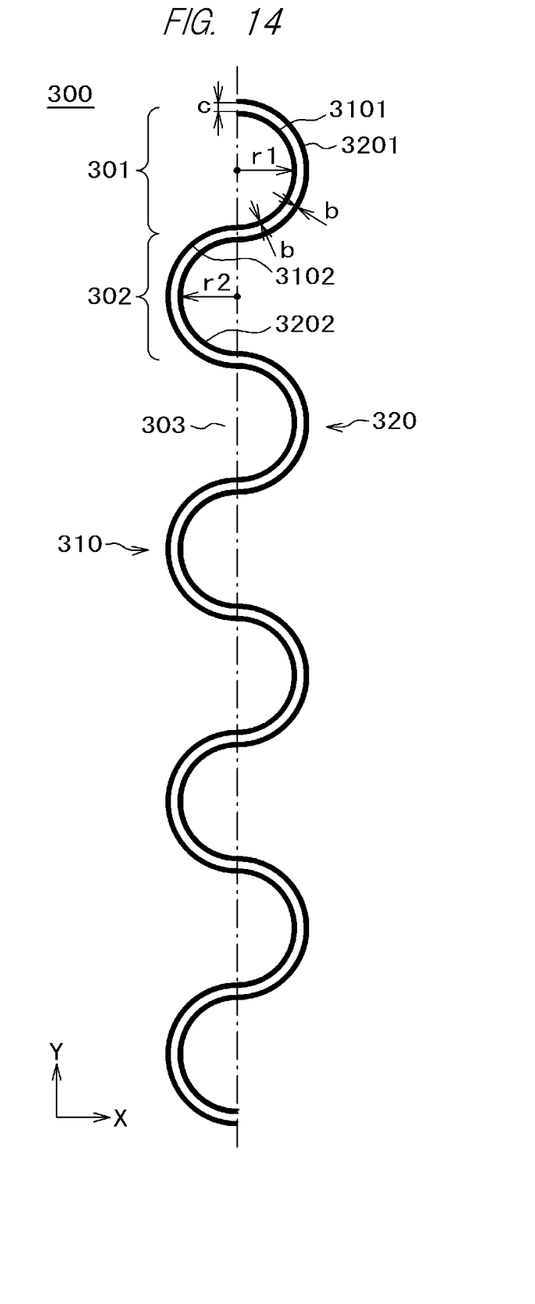
FIG. 14 is a plan view of an inductor in a first modification example.

The shapes of the first inductor 310 and the second inductor 320 configuring a transformer in a first modification example will be described with reference to FIG. 14. FIG. 14 is a plan view of two inductors in a first modification example.

The first inductor 310 and the second inductor 320 include a wiring group 301 and a wiring group 302. The wiring group 301 is configured by: a semicircular wiring 3101 formed by a certain radius (r1); and a semicircular wiring 3201 formed by a radius composed of a radius (r1)+wiring width (b)+wiring interval (c). The wiring 3101 and the wiring 3201 are formed so as to be uniformly separated by the wiring interval (c). The wiring group 302 is configured by: a semicircular wiring 3202 formed by a certain radius (r2); and a semicircular wiring 3102 formed by a radius composed of a radius (r2)+wiring width (b)+wiring interval (c). The wiring 3102 and the wiring 3202 are formed so as to be uniformly separated by the wiring interval (c). Here, as in the embodiment, "c" is larger than "b".

The wiring group 301 and the wiring group 302 are arranged symmetrically with a line 303 that connects both ends of the wiring 3101. Here, the line 303 extends in the Y-axis direction. The first inductor 310 and the second inductor 320 are configured by alternately connecting the wiring group 301 and the wiring group 302, and are configured so as to extend in the Y-axis direction.

In the first modification example, the wiring has no edge portion as compared with the embodiment, and an electric field concentration in a high frequency signal is less than that of the embodiment, so that series resistance at the time of high frequency can be reduced.

Second Modification Example

Figure 15:
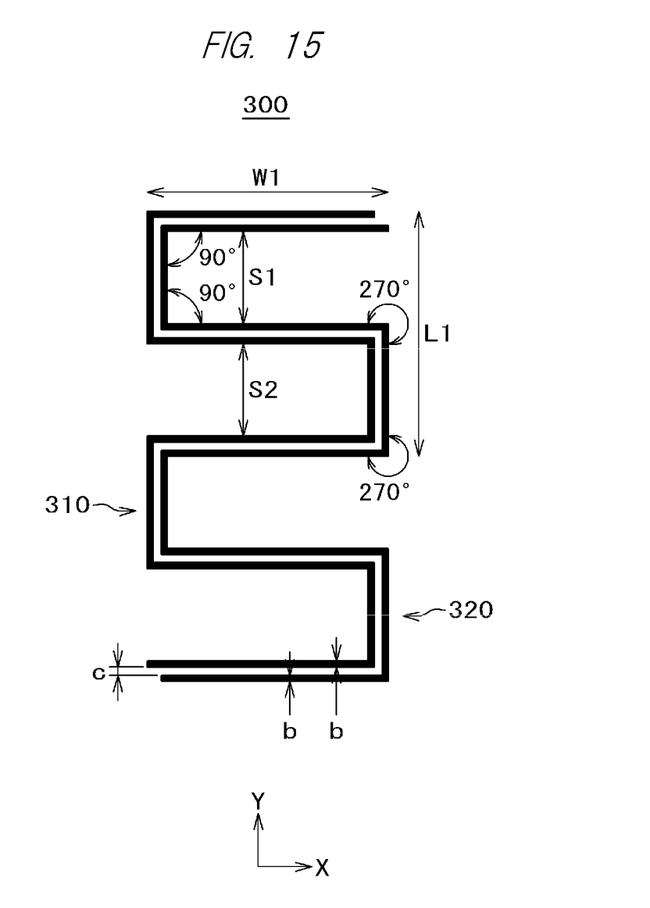
FIG. 15 is a plan view of an inductor in a second modification example.
Figure 16:
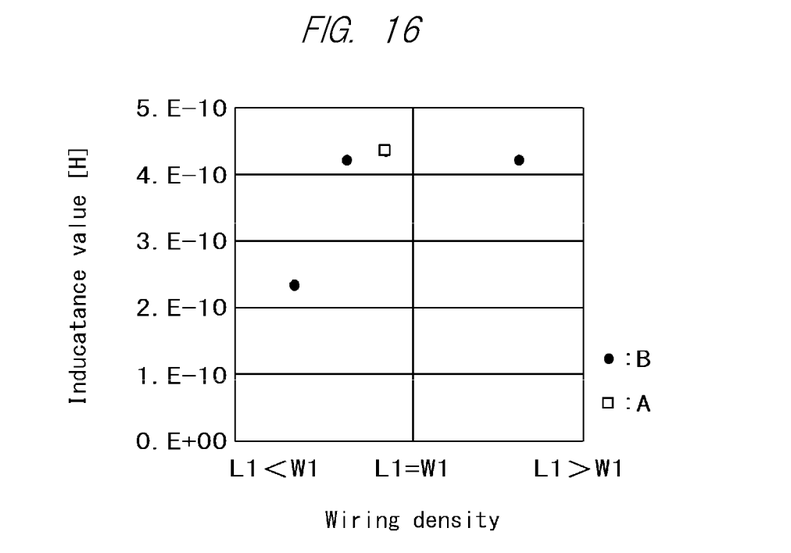
FIG. 16 is a diagram showing respective inductance values of the inductors in the embodiment and the second modification example.
Figure 17:
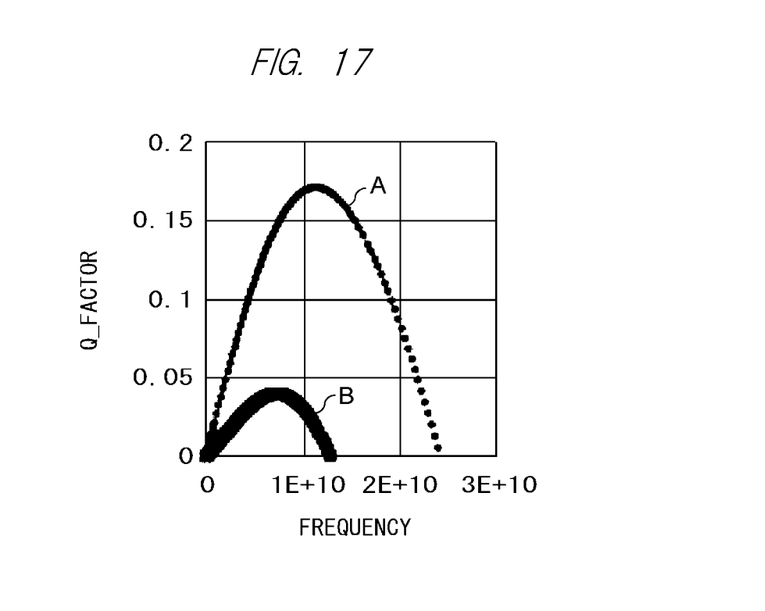
FIG. 17 is a diagram showing a Q value of each of the inductors in the embodiment and the second modification example.

The shapes of the first inductor 310 and the second inductor 320 configuring a transformer in a second modification example will be described with reference to FIGS. 15 to 17. FIG. 15 is a plan view of two inductors in a second modification example. FIG. 16 is a diagram showing respective inductance values of the inductors in the embodiment and the second modification example. FIG. 17 is a diagram showing respective Q values of the inductors in the embodiment and the second modification example.

As shown in FIG. 15, the wirings configuring the first inductor 310 and the second inductor 320 are composed of a wiring extending in an X-axis direction and a wiring extending in the Y-axis direction in a plan view. Similar to the embodiment, the two wirings configuring the first inductor 310 and the second inductor 320 are formed so as to be: arranged in parallel at an interval of "c"; bent at 90° and 270°; and extended in the Y-axis direction. The bending is performed twice in succession at 90° and then twice in succession at 270°, and while these steps are repeated, the wirings are extended in the Y-axis direction. When W1=L1 and S1=S2, the inductance value per unit area is large. Here, "W1" is a length of the wiring configuring the first inductor 310 and the second inductor 320 in the X-axis direction. "L1" is each length of the two wirings configuring the first inductor 310 and the second inductor 320 in the Y-axis direction. "S1" is an interval between the wirings configuring the second inductor 320 in the Y-axis direction. "S2" is an interval between the wirings configuring the first inductor 310 in the Y-axis direction. S1 is preferably 30 μm or more.

FIG. 16 shows that a vertical axis indicates inductance values and a horizontal axis indicates wiring densities. As shown in FIG. 16, when W1=L1 in the second modification example, the inductance value is almost the same as that of the embodiment. In FIG. 16, "A" indicates an inductance value of the embodiment, and "B" indicates an inductance value of the second modification example. In this case, coupling coefficients and resistance values are larger in the second modification example than in the embodiment. FIG. 17 shows that a horizontal axis indicates Q values and a vertical axis indicates frequencies. The Q value is also called a Q_factor. As shown in FIG. 17, the Q value of the embodiment is larger than that of the second modification example. In FIG. 17, "A" indicates the Q value of the embodiment, and "B" indicates the Q value of the second modification example.

Third Modification Example

Figure 18:
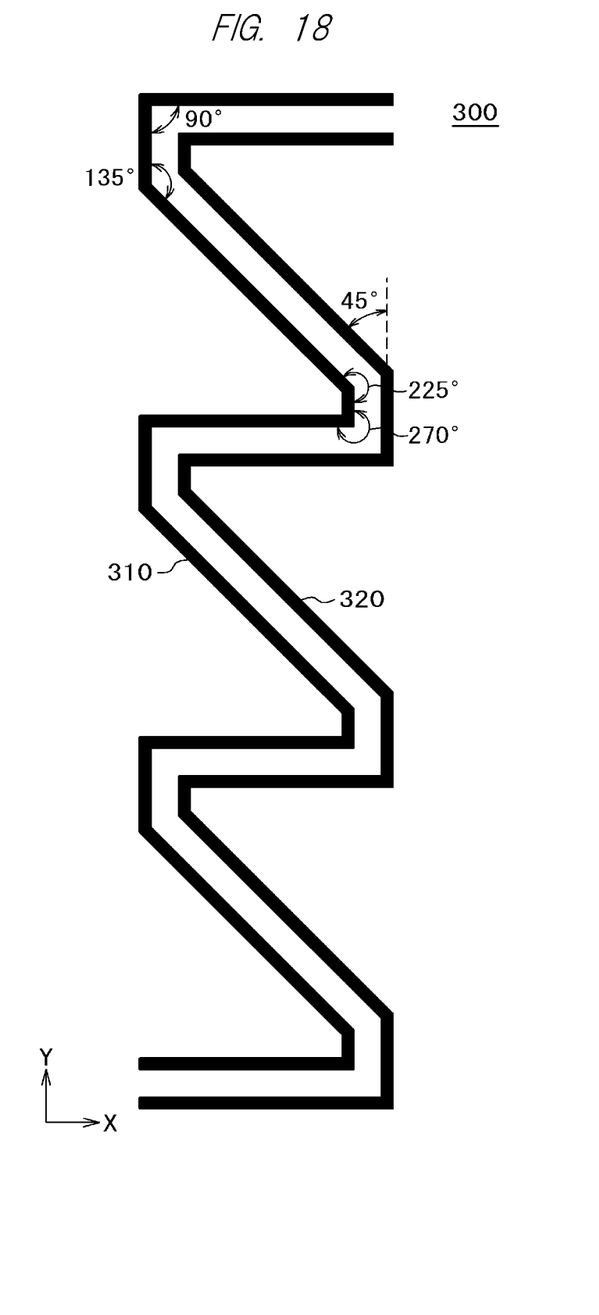
FIG. 18 is a plan view of an inductor in a third modification example.

The shapes of the first inductor 310 and the second inductor 320 configuring a transformer in a third modification example will be described with reference to FIG. 18. FIG. 18 is a plan view of two inductors in a third modification example.

The wirings configuring the first inductor 310 and the second inductor 320 are composed of: a wiring extending in the X-axis direction; a wiring extending in the Y-axis direction; and a wiring extending in a direction of 45 degrees with respect to the Y-axis direction in a plan view. Similar to the embodiment, the two wirings configuring the first inductor 310 and the second inductor 320 are arranged at equal intervals. Further, the two wirings configuring the first inductor 310 and the second inductor 320 are formed so as to be bent at 90°, 135°, 225°, and 270° and to extend in the Y-axis direction by repeating this bending.

Fourth Modification Example

Figure 19:
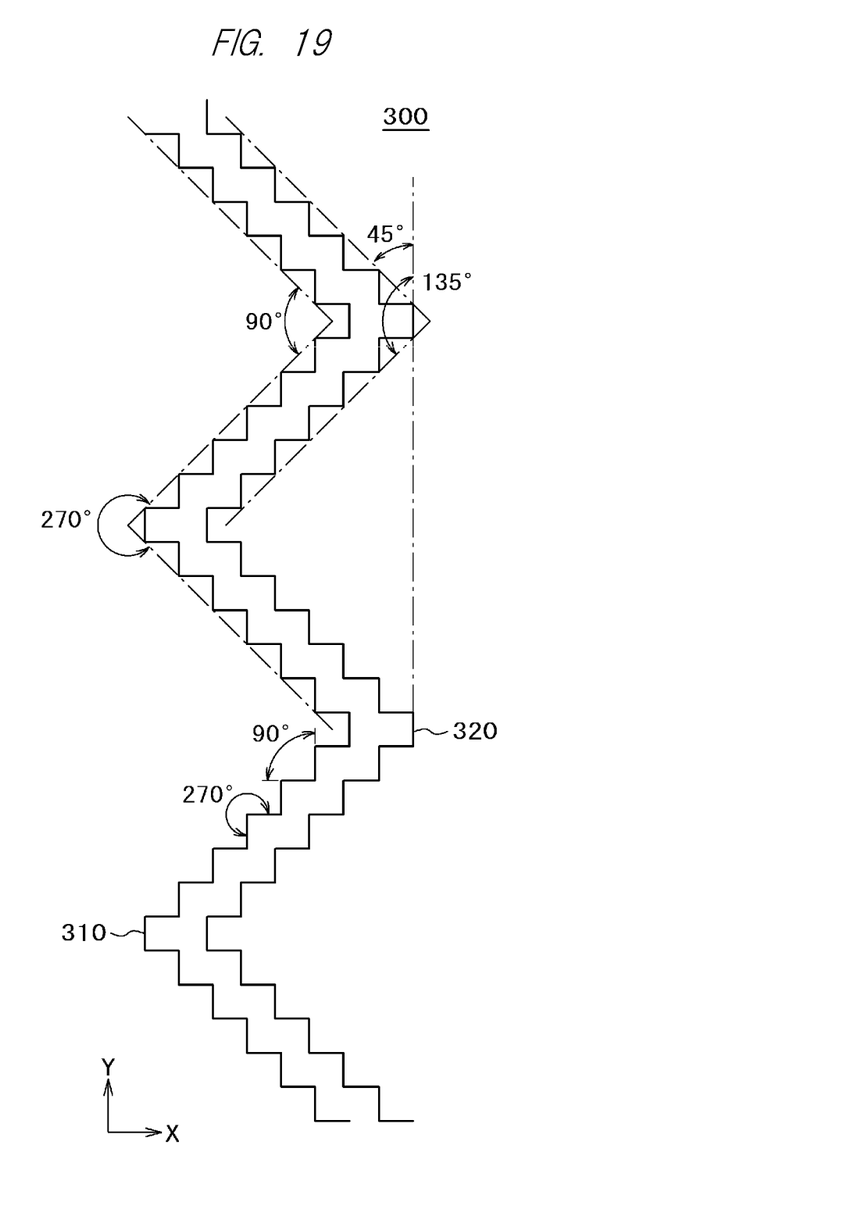
FIG. 19 is a plan view of an inductor in a fourth modification example.

The shapes of the first inductor 310 and the second inductor 320 configuring a transformer in a fourth modification example will be described with reference to FIG. 19. FIG. 19 is a plan view of two inductors in a fourth modification example.

In a macro region, the wirings configuring the first inductor 310 and the second inductor 320 are composed of a wiring of 45 degrees or 135 degrees with respect to the Y-axis direction in a plan view, similarly to the embodiment. Further, the wirings configuring the first inductor 310 and the second inductor 320 are formed so as to: extend each wiring length while being bent at 90° and 270°; be alternately arranged at each bending angle of 90° and 270°; and extend in the Y-axis direction.

On the other hand, in a micro region, the wirings configuring the first inductor 310 and the second inductor 320 are composed of not a wiring of 45 degrees or 135 degrees with respect to the Y-axis direction in a plan view but a wiring extending in the X-axis direction and a wiring extending in the axial direction. Further, the two wirings configuring the first inductor 310 and the second inductor 320 are formed so as to: be bent at 90° and 270°; and extend in a direction of 45° with respect to the Y-axis direction by repeating this bending. However, the micro region at each of folded portions of the wiring in the macro region is continuous at 90° or is continuous at 270°, and this leads to an extension of the wiring. The wiring length is preferably 30 μm or more while the folding angle is repeated at 90° and 90°, or 270° and 270°.

It is difficult to incorporate the optical isolator using the photocoupler in one package, while the isolator of the present disclosure is capable of multi-channel integration. Consequently, for example, an inverter system can be miniaturized. That is, the system can be miniaturized in applications such as motor control, isolated DC-DC, UPS (Uninterruptible Power Supply), display, and lighting control.

Further, it is possible to integrate with a IGBT or be integrated until an MCU. Integrating with the MCU makes it possible to miniaturize the system in applications such as switching power supplies, medical devices, LED lighting, and in-vehicle devices such a body system and a power train system.

The disclosure made by the present discloser has been specifically described based on the embodiments and modification examples. However, the present disclosure is not limited to the above-mentioned embodiments and modification examples, and can be varied or changed in various ways.

For example, explained in the embodiment has been an example in which the first semiconductor chip 10 is provided with a transmission circuit, the first inductor 310, and the second inductor 320, and the second semiconductor chip 20 is provided with a receiving circuit. The first semiconductor chip 10 may be provided with a receiving circuit, the first inductor 310 and the second inductor 320, and the second semiconductor chip 20 may be provided with a transmitting circuit. In this case, the second inductor 320 functions as a transmitting side inductor, and the first inductor 310 functions as a receiving side inductor.

Further, the semiconductor device has been formed by dividing it into two semiconductor chips in the embodiment, but the semiconductor device may be formed on one semiconductor chip. In this case, the first substrate 102 is formed of an SOI (Silicon On Insulator) substrate, and the first circuit 100 and the second circuit 200 are formed on the first substrate 102. An element separation membrane is embedded in the silicon layer of the first substrate 102. A lower end of the element separation membrane reaches the insulating layer of the first substrate 102. The element separation membrane insulates the first circuit 100 and the second circuit 200.

What is claimed is:

1. A semiconductor device comprising:
    a first substrate;
    a multilayer wiring layer formed on the first substrate;
    a first inductor formed into a meander shape on the multilayer wiring layer in a plan view; and
    a second inductor formed into a meander shape on the multilayer wiring layer in the plan view, the second inductor being arranged to be close to and not to overlap with the first inductor in the plan view,
    wherein the first inductor and the second inductor form a transformer,
    wherein the first inductor and the second inductor extend, in the plan view, along a first direction in which one side of the first substrate extends, and
    wherein wirings comprising the first inductor and the second inductor each extends in the first direction while being alternately bent at 90 degrees and 270 degrees in the plan view.

2. The semiconductor device according to claim 1, wherein the wirings configuring the first inductor and the second inductor each extends in the first direction while being alternately bent twice at 90 degrees and twice at 270 degrees in the plan view.

3. The semiconductor device according to claim 2, wherein the first inductor and the second inductor are formed in mutually different wiring layers.

4. The semiconductor device according to claim 2, further comprising:
    a transistor;
    an element separation of the transistor; and
    a separation portion configured so that an insulator is embedded in a trench deeper than that of the element separation,
    wherein a width of the separation portion is configured so as to become larger than a width of a wiring configuring the first inductor and a width of a wiring configuring the second inductor.

5. A semiconductor device according to claim 1, comprising:
- a first substrate;
- a multilayer wiring layer formed on the first substrate;
- a first inductor formed into a meander shape on the multilayer wiring layer in a plan view; and
- a second inductor formed into a meander shape on the multilayer wiring layer in the plan view, the second inductor being arranged to be close to and not to overlap with the first inductor in the plan view,
- wherein the first inductor and the second inductor form a transformer,
- wherein the first inductor and the second inductor extend, in the plan view, along a first direction in which one side of the first substrate extends, and
- wherein wirings configuring the first inductor and the second inductor each extends in the first direction while being alternately bent into semicircular shapes in the plan view.

6. A semiconductor device comprising:
- a first substrate;
- a multilayer wiring layer formed on the first substrate;
- a first inductor formed into a meander shape on the multilayer wiring layer in a plan view;
- a first circuit connected to the first inductor and formed on the first substrate; and
- a second inductor formed into a meander shape on the multilayer wiring layer in the plan view, the second inductor being arranged to be close to and not to overlap with the first inductor in the plan view,
- wherein the first inductor and the second inductor form a transformer, and
- wherein the first inductor and the second inductor extend, in the plan view, along a first direction in which one side of the first substrate extends,
- wherein the first inductor is arranged closer to the first circuit than the second inductor, and
- wherein, in a cross-sectional view, the first inductor and the second inductor are arranged close to the one side of the first substrate, and the second inductor is arranged closer to the one side than the first inductor.

7. The semiconductor device according to claim 6, further comprising:
- a second substrate;
- a second board formed on the second substrate; and
- a wiring connecting the second inductor on the first substrate and the second circuit.

8. The semiconductor device according to claim 7, further comprising a bonding pad formed on the first substrate,
- wherein the second inductor is connected to the bonding pad, and
- wherein the wiring is a bonding wire connected to the bonding pad.

9. The semiconductor device according to claim 6, wherein the first circuit is a transmission circuit, and includes a transmission side driver circuit connected to the first inductor.

10. The semiconductor device according to claim 9, wherein the first inductor has: one end connected to the transmission side driver circuit; and the other end connected to a power supply wiring or a ground wiring.

11. The semiconductor device according to claim 6, wherein the first inductor and the second inductor are formed in mutually different wiring layers.

* * * * *